United States Patent
Ravi-Chandar et al.

(10) Patent No.: US 6,191,074 B1
(45) Date of Patent: *Feb. 20, 2001

(54) FABRICATION OF SUPERCONDUCTING WIRES AND RODS

(75) Inventors: Krishnaswamy Ravi-Chandar, Sugar Land; Devamanohar Ponnusamy; Kamel Salama, both of Houston, all of TX (US)

(73) Assignee: University of Houston, Houston, TX (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/831,235

(22) Filed: Apr. 2, 1997

Related U.S. Application Data

(62) Division of application No. 08/372,615, filed on Jan. 13, 1995, now Pat. No. 5,656,574.

(51) Int. Cl.[7] .................................................. H01B 39/24
(52) U.S. Cl. ..................... 505/430; 505/740; 505/432; 427/62; 264/177.11; 264/211.11; 29/599
(58) Field of Search ................... 505/430, 740, 505/432; 427/62; 264/177.11, 211.11; 29/599

(56) References Cited

U.S. PATENT DOCUMENTS

| | | | |
|---|---|---|---|
| H1239 | * 10/1993 | Dusek | 264/63 |
| 4,965,249 | 10/1990 | De With et al. | 505/1 |
| 4,997,812 | 3/1991 | Huang | 505/471 |
| 5,004,722 | * 4/1991 | Tallman | 505/1 |
| 5,091,221 | 2/1992 | Chu et al. | 505/471 |
| 5,166,130 | 11/1992 | Enomoto et al. | 505/1 |
| 5,210,071 | * 5/1993 | LoIacono et al. | 505/1 |
| 5,260,263 | 11/1993 | Enomoto et al. | 505/1 |
| 5,338,507 | 8/1994 | Anderson et al. | 505/471 |

OTHER PUBLICATIONS

M.T. Lanagan, R.B. Poeppel, J.P. Singh, D.I. Dos Santos, J.K. Lumpp, U. Balachandran, J.T. Dusek and K.C. Goretta, *J. Less Comnon Metals*, 149, 305 (1989).

S.R. Su, M. O'Connor, M. Levinson and P.G. Rossoni, *Physica C*, 178, 81 (1991).

L.D. Woolf, W.A. Raggio, F.E. Elsner, M.V. Fisher, R.B. Stephens, T.L. Figueroa, C.H. Shearer, J.D. Rose, K.M. Schaubel, R.A. Olstad, T. Ohkawa, D.M. Duggan, M. DiMartino and R.L. Fagaly, *Appl. Phys. Lett.*, 58, 534 (1991).

H. Shimizu, H. Kumakura and K. Togano, *Jpn. J. Appl. Phys.*, 27, L414 (1988).

(List continued on next page.)

*Primary Examiner*—Brian K. Talbot
(74) *Attorney, Agent, or Firm*—Fulbright & Jaworski

(57) ABSTRACT

The fabrication of superconducting wires and rods having desired and consistent electrical and mechanical properties, in particular those based on Yttrium Barium Copper Oxide (YBCO) and Bismuth Strontium Calcium Copper Oxide (BSCCO), is disclosed. The first fabrication step is to form an extrudable paste by mixing YBCO or BSCCO superconducting powder with a set of organic additives, which include binder, plasticizer, lubricant, dispersant, and a solvent. The following additional steps are performed on both YBCO and BSCCO based wires or rods: (i) using a piston extruder to extrude the superconducting wire or rod; (ii) drying the wire or rod to remove the solvent; and (iii) subjecting the wire or rod to a binder burn-out treatment to remove the remaining organic additives. In addition, YBCO wires and rods also require a sintering step, while BSCCO wires and rods also require cold isostatic pressing and heat treatment steps. The formation of cracks in thicker YBCO and BSCCO based rods during the drying and heating process steps is avoided by extruding hollow rods. The additives, processing parameters, and processing stages used to fabricate the superconducting wires and rods help achieve desired and consistent electrical and mechanical properties.

17 Claims, 11 Drawing Sheets

PROCESSING ADDITIVES

| CONSTITUENT | FUNCTION | ADDITIVE | WEIGHT % (YBCO) | WEIGHT % (BSCCO) |
|---|---|---|---|---|
| BINDER | GREEN STRENGTH | ETHYL CELLULOSE | 2.0–2.5 | 2.5–3.0 |
| PLASTICIZER | FORMABILITY | GLYCEROL | 0.7 | 0.75 |
| LUBRICANT | INTERPARTICLE & DIE WALL LUBRICATION | STEARIC ACID | 0.4 | 0.5 |
| DISPERSANT | CONTROL OF INTERFACE | TRIOLEIN | 0.1 | 0.1 |
| SOLVENT | VEHICLE FOR ADDITIVES | BUTYL CARBITOL ETHYL ALCOHOL | 15 | 18 |

OTHER PUBLICATIONS

G.Y. Onoda, L.L. Hench, "The Rheology of Organic Binder Solutions" in *Ceramic Processing Before Firing*, by G.Y. Onoda, John Wiley, 1978.

H. Kumakura, K. Togano and H. Maeda, *J. of Appl. Phys.*, 67 (1990).

S.S. Oh and K. Osamura, *J. of Mat. Sci.*, 26 (1991).

U. Endo, S. Koyama and T. Kawai, *Jap. J. of Appl. Phys.*, 27 (1988).

S.S. Oh and K. Osamura, *Supercond. Sci. Tech.*, 4 (1991).

I. Bransky and J. Bransky, *J. Appl. Phys.*, 66, 5510 (1989).

M.K. Ihm, B.R. Powell and R.L. Bloink, *J. Mat. Sci.*, 25, 1664 (1990).

F. Yeh and K.W. White, *J. Appl. Phys.*, 70, 4989 (1991).

D. Ponnusamy and K. Ravi–Chandar, "Extrusion of Superconducting Wires of $YBa_2Cu_3O_{7-x}$," *J. Mater. Res.*, vol. 8, No. 2, Feb. 1993, pp. 268–273.

R.B. Poeppel, et al., "Fabrication and Wire Extrusion of Ceramic Superconductors," Materials & Components Technology Division, Argonne Natl. Laboratory, Argonne, IL 60439 (pp. 1–7).

Suguru Suzuki, "Effect of Extrusion on the Critical Current Density of $Bi_{1.4}Pb_{0.6}Sr_2Ca_2Cu_3O_x$ Superconducting Wires," *J. Am. Ceram. Soc.*, 74[4], pp. 714–717 (Apr. 1991).

Roger N. Wright, et al., "Mechanical Considerations in the Processing of High $T_C$ Superconductors," *The Minerals, Metals & Materials Society*, 1990, pp. 217–239.

\* cited by examiner

PROCESSING ADDITIVES

| CONSTITUENT | FUNCTION | ADDITIVE | WEIGHT % (YBCO) | WEIGHT % (BSCCO) |
|---|---|---|---|---|
| BINDER | GREEN STRENGTH | ETHYL CELLULOSE | 2.0–2.5 | 2.5–3.0 |
| PLASTICIZER | FORMABILITY | GLYCEROL | 0.7 | 0.75 |
| LUBRICANT | INTERPARTICLE & DIE WALL LUBRICATION | STEARIC ACID | 0.4 | 0.5 |
| DISPERSANT | CONTROL OF INTERFACE | TRIOLEIN | 0.1 | 0.1 |
| SOLVENT | VEHICLE FOR ADDITIVES | BUTYL CARBITOL ETHYL ALCOHOL | 15 | 18 |

FIG. 1

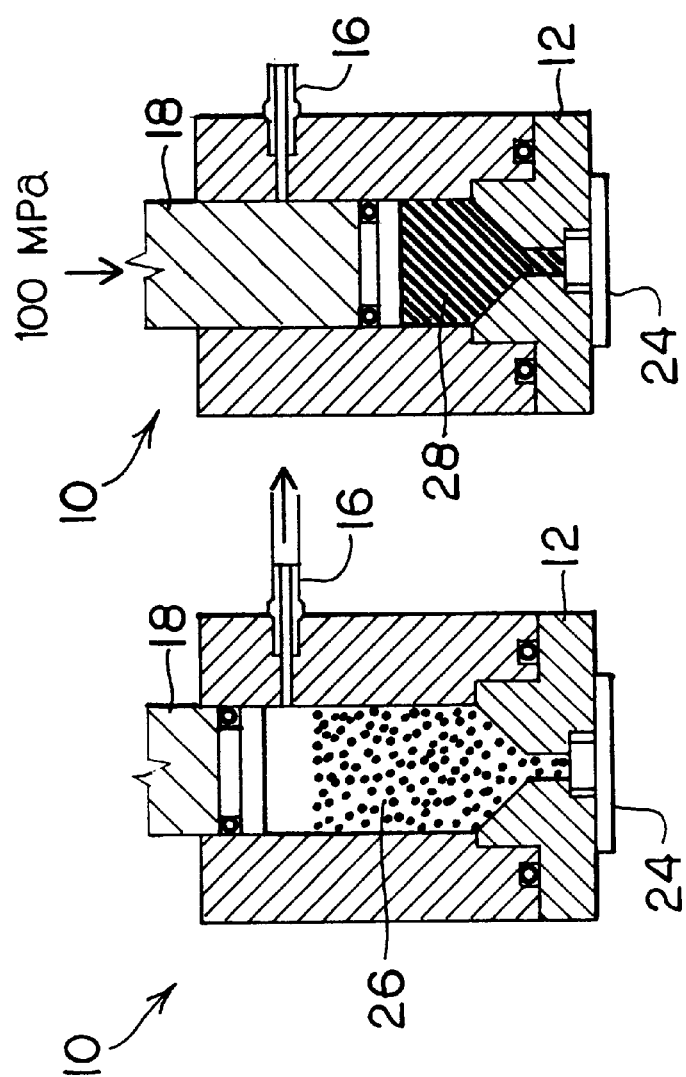

| d (mm) | D (mm) | l (mm) | D/d | l/d |
|---|---|---|---|---|
| 1.0 | 16.0 | 1.6 | 16.0 | 1.6 |
| 2.0 | 16.0 | 2.0 | 8.0 | 1.0 |
| 5.0 | 55.0 | 6.0 | 11.0 | 1.2 |
| 10.0 | 55.0 | 10.0 | 5.5 | 1.0 |

DRYING TEMPERATURE AND TIME

| WIRE/ROD DIAMETER (mm) | DRYING TIME – STILL AIR 25°C (DAYS) | DRYING TIME – FLOWING AIR 60°C (DAYS) |
|---|---|---|
| 0.5–1.5 | 4 | 10 |
| 2.0–5.0 | 8 | 20 |
| 5.0–15.0 | 12 | 30 |

FIG. 4

| OD cm | ID cm | LENGTH cm | $I_c$ A | $J_c$ A/cm² |
|---|---|---|---|---|
| 0.16 | – | 30.0 | 18 | 895 |
| 0.35 | – | 30.0 | 40 | 415 |
| 0.75 | 0.15 | 30.0 | 125 | 295 |
| 1.4 | 0.6 | 3.5 | 300 | 240 |

FIG. 10

| OD cm | ID cm | LENGTH cm | $I_c$ A | $J_c$ A/cm² |
|---|---|---|---|---|
| 0.35 | – | 12.0 | 75 | 750 |
| .65 | – | 10.0 | 215 | 650 |
| 1.7 | 0.95 | 7.5 | 800 | 525 |

FIG. 11

FABRICATION OF SUPERCONDUCTING WIRES AND RODS

This is a divisional of application Ser. No. 08/372,615, filed Jan. 13, 1995, now U.S. Pat. No. 5,656,574.

BACKGROUND OF THE INVENTION

1. Field of the Invention

The present invention relates to the fabrication of superconducting wires and rods. More particularly, the present invention primarily relates to the fabrication of superconducting wires and rods made from Yttrium Barium Copper Oxide and Bismuth Strontium Calcium Copper Oxide.

2. Brief Description of the Related Technology

High $T_c$ superconductivity was first discovered in Yttrium Barium Copper Oxide (YBCO) in 1987. Since then, much progress has been made in discovering other compounds and in understanding the fundamental properties of these materials. At the same time, significant effort has been directed towards identifying the potential applications of these new materials, and developing the processing conditions for fabrication of useful forms of these materials, such as wires and rods.

Some of the large scale applications of superconducting wires are in power generation and transmission, high field magnets, magnetic energy storage, and current leads for low $T_c$ superconducting magnets and magnetic energy storage systems. These materials are also used in other applications like electronic devices and magnetometers.

Conventionally, wires of ductile materials are made by extrusion or by rolling and drawing processes. These processes cannot be directly applied to the high $T_c$ superconductors, which are ceramic materials and not capable of plastic deformation. Several variations of these processes are being developed, however, to adapt them to ceramic materials. These include the powder-in-tube process used to fabricate metal-clad composite and the plastic extrusion process used to fabricate bare wires and rods. Other processes like surface coating techniques are also being pursued. See S. Jin, R. C. Sherwood, R. B. Van Dover, T. H. Tiefel and D. W. Johnson, Jr., *Appl. Phys. Lett.*, 51, 203 (1987); M. T. Lanagan, R. B. Poeppel, J. P. Singh, D. I. Dos Santos, J. K. Lumpp, U. Balachandran, J. T. Dusek and K. C. Goretta, *J. Less Common Metals*, 149, 305 (1989); S. R. Su, M. O'Connor, M. Levinson and P. G. Rossoni, *Physica C*, 178, 81 (1991); L. D. Woolf, W. A. Raggio, F. E. Elsner, M. V. Fisher, R. B. Stephens, T. L. Figueroa, C. H. Shearer, J. D. Rose, K. M. Schaubel, R. A. Olstad, T. Ohkawa, D. M. Duggan, M. DiMartino and R. L. Fagaly, *Appl. Phys. Lett.*, 58, 534 (1991); and H. Shimizu, H. Kumakura and K Togano, *Jpn. J. Appl. Phys.*, 27, L414 (1988), which are incorporated herein by reference.

The powder-in-tube process uses a preform composed of a nominal ductile metal tube packed with fine superconducting powder. A wire is rolled, drawn, or both rolled and drawn in successive stages until the required final dimensions are achieved. The resulting composite superconducting wire is easily wound into coil shapes. When the radius of the resulting superconducting wire is small, the wire is first wound into a coil and then the coil is heat treated to sinter the powder.

In the case of the plastic extrusion process, superconducting powder is mixed with a set of organics to prepare a paste, which is then extruded to form the desired cross sections. Some of the advantages of this process over the powder-in-tube process are the following: (i) there is no problem of degradation or contamination from other material; (ii) oxygen annealing is comparatively easy, since the surface is exposed; (iii) the monolithic nature of the wire makes it useful for applications like current leads, where metallic cladding is undesirable; and (iv) this process can be applied to the fabrication of different sections and large cross-section area rods.

The plastic extrusion process consists of several stages like paste preparation, extrusion, drying, binder burn-out, sintering and oxygenation. Each one of these stages involves several parameters which affect the quality of the final product and its microstructure. The plastic extrusion process itself is used in the fabrication of certain conventional ceramic shapes. However, in prior attempts at applying the plastic extrusion process to the fabrication of superconducting wires and rods, the additives and processing parameters used have not achieved wires and rods having desired and consistent electrical/superconducting and mechanical properties.

The present invention provides the additives, processing parameters, and processing stages necessary to achieve desired and consistent electrical/superconducting and mechanical properties. For example, the present invention: (i) uses polymeric additives which form an extrudable paste but do not degrade the final properties of superconductor; (ii) optimizes the amount of each of the additives; (iii) optimizes extrusion parameters like compaction load and extrusion rate; and (iv) provides for the removal of solvent first and other polymeric additives later through proper heat treatment and sintering parameters.

SUMMARY OF THE INVENTION

The present invention relates to the fabrication of superconducting wires and rods having desired and consistent electrical and mechanical properties. The fabrication of superconducting wires and rods based on Yttrium Barium Copper Oxide (YBCO) and Bismuth Strontium Calcium Copper Oxide (BSCCO) is the primary focus. The present invention employs a plastic extrusion-type process.

The fabrication process for YBCO wires and rods has several process steps in common with the fabrication process for BSCCO wires and rods. The first step in the fabrication of YBCO and BSCCO superconducting wires and rods is the preparation of an extrudable paste. Extrudable paste is formed by mixing superconducting powder, comprising YBCO or BSCCO, with a set of organic additives, which include binder, plasticizer, lubricant, dispersant, and a solvent. Preferably, the binder is ethyl cellulose, the plasticizer is glycerol, the lubricant is stearic acid, and the dispersant is triolein. The solvent may be butyl carbitol, ethyl alcohol or various mixtures of both.

The next step in the fabrication process is to use a piston extruder to extrude the superconducting wire or rod. A suitable piston extruder comprises a die, barrel, port for connecting a vacuum pump, and a ram. The die includes a finishing tube and extrusion nozzle. The dimensions of the piston extruder are designed to promote slip flow and avoid laminations in the extrusion.

The use of the piston extruder involves three main steps. In the first main step, the extrusion nozzle is first closed, or plugged with a plug, and the extrudable paste is loaded in the barrel in the form of small, loose granules. The granules are preferably made by cutting the paste into small cubes having sides of about 2 to 3 mm. The barrel, filled with the granules, is then connected to a vacuum pump through the port, and is subjected to a vacuum of about 200 millitorr. The vacuum removes air in the extrudable paste and thereby reduces the defects and improves the extrusion behavior of the wires and rods. The second main step is to compact the paste by using the ram to apply a compaction stress of about 100 MPa. The third and final main step is to open or unplug the nozzle and then move the ram at a constant rate of about 0.02 to 0.1 inch per minute to extrude the wire or rod.

The next step in the process of fabricating YBCO and BSCCO wires and rods is to dry the extruded wire or rod to remove the solvent. Since this drying results in shrinkage, the drying conditions are chosen so as to avoid cracking of the wire or rod. The extruded wire or rod is first held in still air at room temperature until about 20% of the solvent is lost. The wire or rod is then transferred to a convection dryer, where it is exposed to flowing warm air at 60° C. The time periods for drying depend upon the diameter of the wire or rod.

The next fabrication step involves subjecting the dried wire or rod to a binder burn-out treatment for removing the remaining organic additives. The dried wire or rod is first heated in a furnace to a temperature of about 100° C. Then, in the temperature range of 100° C. to 300° C., wires are heated in flowing oxygen at a rate of about 15° C. per hour, while rods are heated in flowing oxygen at a rate of about 6° C. per hour. Under the terminology of the present invention, a "wire" has a diameter of less than about 2 mm, while a "rod" has a diameter equal to or greater than about 2 mm. Above 300° C., the heating rate is increased to about 20° C. per hour, and heating in flowing oxygen continues until a temperature of about 500° C. is reached.

The oxygen flow rate in the binder burn-out process depends upon the furnace tube diameter, the temperature, and the amount of wire or rod being processed. For example, 100 grams of extruded wire, heated in a furnace tube of diameter 7.5 cm, requires an oxygen flow rate of at least 2 liters per minute as the wire is heated to 300° C. Above 300° C., this rate is reduced to 0.25 liters per minute. Each additional 100 grams requires about an additional 2 liters per minute, in the temperature range of about 100° C. to 300° C., and about an additional 0.25 liters per minute above 300° C. In general, the oxygen flow rate is increased as the furnace tube diameter or the amount of wire or rod being heated is increased.

Thicker rods, having diameters 10 mm and above, may have poor properties due to the formation of cracks during the drying and heating steps. The formation of cracks in thicker rods is completely avoided by the extrusion of hollow rods. This is accomplished by attaching a mandrel to the ram of the piston extruder.

In the case of YBCO based superconducting wires and rods, an additional and final process step is to subject the wire or rod to sintering at about 900° C. in an oxygen atmosphere for about 24 hours. This results in a YBCO wire or rod having a fine microstructure with a uniform grain size of 5 μm, and a density of 90–95% of theoretical density.

The final fabrication steps of BSCCO superconducting wires and rods involves cold isostatic pressing and heat treatment steps. In cold isostatic pressing, the BSCCO wire or rod is subjected to a quasi-isostatic load in such a way that the wire or rod experiences maximum load in the radial direction. This is accomplished by using a loading fixture. The BSCCO wire or rod (after binder burn-out) is packed inside a latex tube, and stoppers are used as closures to seal both ends of the tube. A disk is then attached to each stopper. Next, this assembly is placed in a support structure or frame. Then, when an isostatic load is applied, the support structure bears the axial load while the wire or rod experiences a mostly radial load. The isostatic load applied is preferably about 40 ksi. In the case of hollow rods, a mandrel or rod should be inserted into the hollow space prior to applying an isostatic load.

After the cold isostatic pressing step, the BSCCO wire or rod is subjected to a heat treatment step. The wire or rod is heated for about 72 hours in a furnace atmosphere of about 9% oxygen and about 91% argon at a temperature of about 830° C.

The BSCCO wire or rod is then subjected to a second cold isostatic pressing step. The wire or rod is packed again in the latex tube and placed in the support fixture described above, and an isostatic load of 60 ksi is applied.

The final processing step for BSCCO wires and rods is a second heat treatment. The second heat treatment is done at about 840° C. in an atmosphere of about 9% oxygen and about 91% argon for about 72 hours.

One potential application for wires and rods fabricated by the present invention is use as current leads in low $T_c$ superconducting equipment. Current leads made from the superconducting wires and rods reduce resistance heating and heat conduction, thereby cutting down the superconducting equipment's consumption of liquid helium. The superconducting leads can be made as single, large area wires or a rod comprising a multifiliment composite of wires.

BRIEF DESCRIPTION OF THE DRAWINGS

A better understanding of the present invention can be obtained when the following detailed description of the preferred embodiment is considered in conjunction with the following drawings, in which:

FIG. 1 is a table of additives for superconducting wires and rods fabricated in accordance with the present invention;

FIGS. 2a–c are cross-sectional drawings of a piston extruder as used in accordance with the present invention in the fabrication of superconducting wires and rods;

FIG. 4 is a table of drying temperatures and times for superconducting wires and rods fabricated in accordance with the present invention;

FIGS. 10 and 11 are tables of electrical properties versus dimensions for superconducting wires and rods fabricated in accordance with the present invention;

DESCRIPTION OF THE PREFERRED EMBODIMENTS

Figures 3A, 3B:
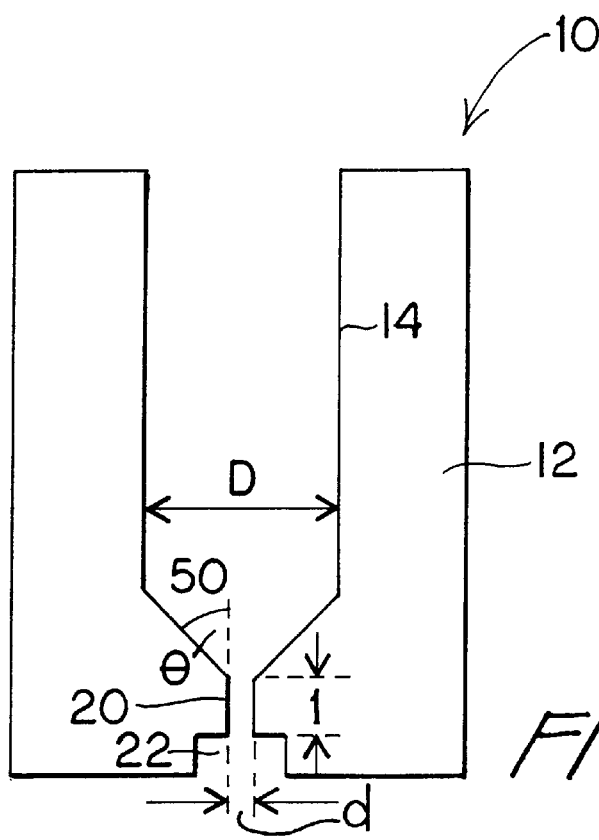
FIG. 3a is a cross-sectional drawing illustrating the dimensions of a piston extruder used in accordance with the present invention.
FIG. 3b is a table of the dimensions of a piston extruder used in accordance with the present invention.

I. Plastic Extrusion Process Steps for YBCO and BSCCO Based Superconducting Wires and Rods The present invention is primarily concerned with the fabrication of wires and rods of YBCO and Bismuth Strontium Calcium Copper Oxide (BSCCO). In the case of BSCCO, there are several superconducting phases. The most common of these is $Bi_2Sr_2Ca_2Cu_3O_{10}$ (2223 phase), which has a $T_c$ of 110K, and $Bi_2Sr_2CaCu_2O_8$ (2212 phase), which has a $T_c$ of 85K. The 2223 phase is preferred over the 2212 phasd in bulk processing since: (a) the 2223 phase has a higher $T_c$; and (b) a highly oriented polycrystalline microstructure of 2223 can be obtained by a combination of hot or cold deformation and heat treatment.

A. Process Steps Common to Both YBCO and BSCCO.

The following plastic extrusion process steps ((i)–(v)) are common to both YBCO and BSCCO based wires and rods. In addition to steps (i)–(v), superconducting wires and rods made from YBCO compounds require a sintering process step, while superconducting wires and rods made from BSCCO compounds require cold isostatic pressing and heat treatment steps. These additional processing steps are also discussed below.

(i) Additives.

The first step in the fabrication of superconducting wires and rods by plastic extrusion is the preparation of an extrudable paste. This is accomplished by mixing superconducting powder, comprising YBCO or BSCCO, with a set of organic additives, which include binder, plasticizer, lubricant, dispersant and a solvent. See J. S. Reed, *Principles of Ceramic Processing*, John Wiley, 1988; and D. Ponnusamy and K. Ravi-Chandar, *Extrusion of Superconducting Wires of* $YBa_2Cu_3O_{7-x}$, J. Mater. Res.; Vol. 8, No. 2 (Feb. 1993), which are incorporated herein by reference.

The binder consists of polymer molecules that are adsorbed, and bridge between ceramic particles to provide interparticle adhesion. Ethyl cellulose is a suitable binder due to its formability, bond strength, and above all, low non-combustible residues.

Plasticizers consist of small polymer molecules which, when distributed among the larger binder molecules, cause them to pack less densely, thereby increasing the flexibility of the binder. Preferably, glycerol is used as the plasticizer since its is compatible with ethyl cellulose.

Lubricants and dispersants are added to modify the Theological characteristics of the extrudable paste, to avoid the formation of agglomerates, and to reduce the friction with the die walls of a piston extruder (discussed below). Stearic acid, which is a very common additive in ceramic processing, serves all of these functions and is a suitable lubricant.

Dispersants are substances that locate themselves at a solid-liquid interface or other type of interface and alter the characteristics of the interface. The addition of a very small amount of dispersant improves the wettability of a ceramic particle surface, which causes each particle to be coated uniformly with the polymer additives. The presence of a dispersant during the mixing process also avoids the formation of agglomerates. Triolein is a suitable dispersant for the paste of the present invention. Triolein, which is more commonly known as glyceryl trioleate, is a commercially and technically important dispersant used in a wide range of industries, including ceramic processing.

The solvent acts as the medium into which the organic additives and the ceramic powder are placed. Butyl carbitol, ethyl alcohol and various mixtures of both may be used as solvents.

The superconducting powder is mixed with the organic additives in a mortar and pestle by applying shear stresses which are essential to break down the agglomerates. The approximate percentage of the various additives is set forth in the table of FIG. 1. The amounts of the various additives were determined by empirical methods developed by Onoda and by experimentation. See G. Y. Onoda, L. L. Hench, "The Rheology of Organic Binder Solutions" in *Ceramic Processing Before Firing*, edited by G. Y. Onoda (John Wiley, 1978), which is incorporated herein by reference.

(ii) Die Design.

A piston extruder 10 is used for the extrusion of the superconducting wires and rods. See FIGS. 2a–2c and 3a. The piston extruder 10 comprises die 12, barrel 14, port 16 (not shown in FIG. 3a) for connecting a vacuum pump, and ram 18 (not shown in FIG. 3a). The die 12 includes a finishing tube 20, and extrusion nozzle 22. The design of piston extruder 10 is based upon the basic mechanics of plastic extrusion and is not discussed in detail here. The design is governed by the consistency and the Theological properties of the paste, such as shear strength and viscosity, and is not material specific. The dimensions of piston extruder 10, mainly the reduction ratio (D/d), the die angle (θ), and the aspect ratio of the nozzle (l/d), are all chosen so as to promote slip flow and avoid laminations in the extrusion. See FIGS. 3a and 3b. The table in FIG. 3b sets forth some examples of suitable numerical values for the reduction ratio, die angle, and aspect ratio of the nozzle.

(iii) Extrusion Process.

The extrusion process is done in piston extruder 10 in three steps, as shown in FIGS. 2a–2c. As illustrated in FIG. 2a, the extrusion nozzle 22 of piston extruder 10 is first closed, or plugged with plug 24, and the paste is loaded in barrel 14 in the form of small, loose granules 26. The granules are preferably made by cutting the paste into small cubes having sides of about 2 to 3 mm. The barrel 14, filled with granules 26, is connected to a vacuum pump (not shown) through port 16 and is subjected to a vacuum of about 200 millitorr. The vacuum step is important because pastes and slurries contain pockets of trapped air which if not removed might result in pores or cracks on the final product. Subjecting the paste within extruder 10 to a vacuum should remove the air and reduce these defects and also significantly improve the extrusion behavior.

As illustrated in FIG. 2b, the paste, with the air removed, is then compacted to form a homogeneous dense paste by using ram 18 to apply a compaction stress of about 100 MPa. The compacted paste is identified in FIG. 2b as reference numeral 28.

As illustrated in FIG. 2c, after compaction, the nozzle 22 is opened or unplugged and the ram 18 pushes at a constant rate of about 0.02 to 0.1 inch per minute to extrude a wire or rod 30. The exact rate depends upon the wire or rod diameter and the reduction ratio (D/d). The diameter of the extruded wire or rod is the same as the diameter (d) of the nozzle 22.

(iv) Drying.

Drying is the process of removing the solvent from the extruded wire or rod. The drying results in shrinkage of the wire or rod. Drying conditions are chosen so as to avoid cracking due to this shrinkage. During an initial period, the extruded wire or rod is held in still air at room temperature. During this initial period, the rate of removal of solvent increases until about 20% of the solvent is lost. The wire or rod is then transferred to a convection drier, where it is exposed to flowing warm air at 60° C. During this period, the rate of solvent removal remains constant. The time periods for drying depend upon the diameter of the wire or rod. Examples of drying time periods are shown in the table of FIG. 4.

(v) Binder Burn-Out.

Figure 5:
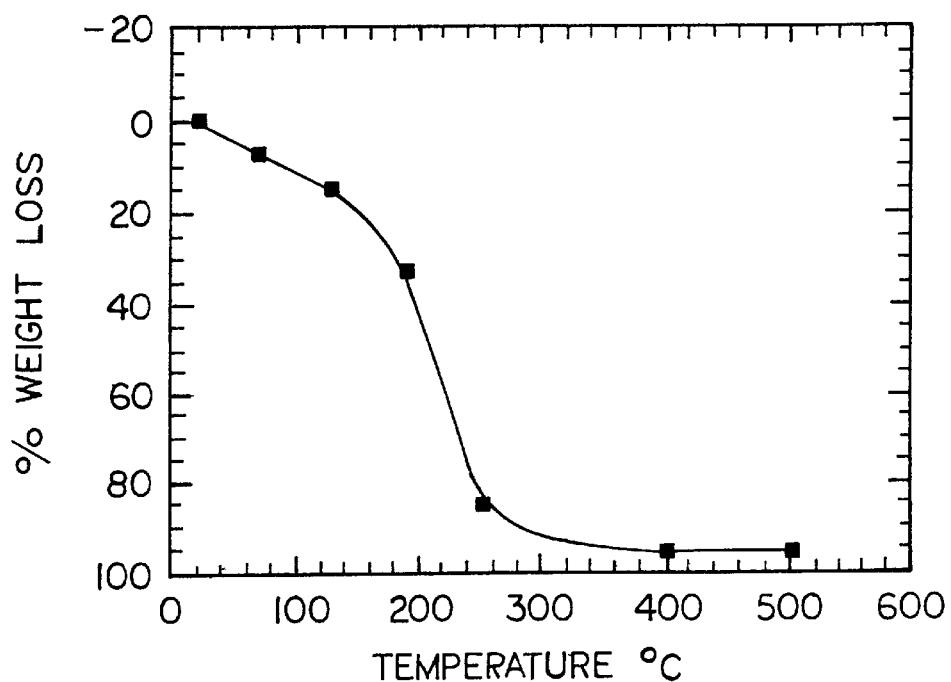
FIG. 5 is a graph illustrating the percentage of additives lost during heating of superconducting wires and rods fabricated in accordance with the present invention.

Next, the dried wire or rod is subjected to a binder burn-out treatment for removing the remaining organic additives. A wire or rod with the organic additives removed is referred to as a green compact. The weight loss versus temperature relationship for ethyl cellulose is shown in FIG. 5.

The dried wire or rod is first heated in a furnace to a temperature of about 100° C. The bulk of the removal then takes place in a narrow band between about 100° C. and 300° C., though weight loss continues until higher temperatures. See FIG. 5. Within this range of temperatures, wires are heated at a rate of about 15° C. per hour, while rods are heated at a rate of about 6° C. per hour. Under the terminology of the present invention, a "wire" has a diameter of less than about 2 mm, while a "rod" has a diameter equal to or greater than about 2 mm. Above 300° C., the heating rate is increased to about 20° C. per hour for both wires and rods, and the heating continues until a temperature of about 500° C. is reached.

The wires and rods are heated in flowing oxygen. The oxygen flow rate depends upon the furnace tube diameter, the temperature, and the amount of wire or rod being processed. For example, 100 grams of extruded wire, heated in a furnace tube of diameter 7.5 cm, requires an oxygen flow rate of at least 2 liters per minute as the wire is heated to 300° C. Above 300° C., this rate is reduced to a much smaller value of about 0.25 liters per minute. Each additional 100 grams requires about an additional 2 liters per minute, in the temperature range of about 100° C. to 300° C., and about an additional 0.25 liters per minute above 300° C. In general, the oxygen flow rate is increased as the furnace tube diameter or the amount of wire or rod being heated is increased.

Figure 6:
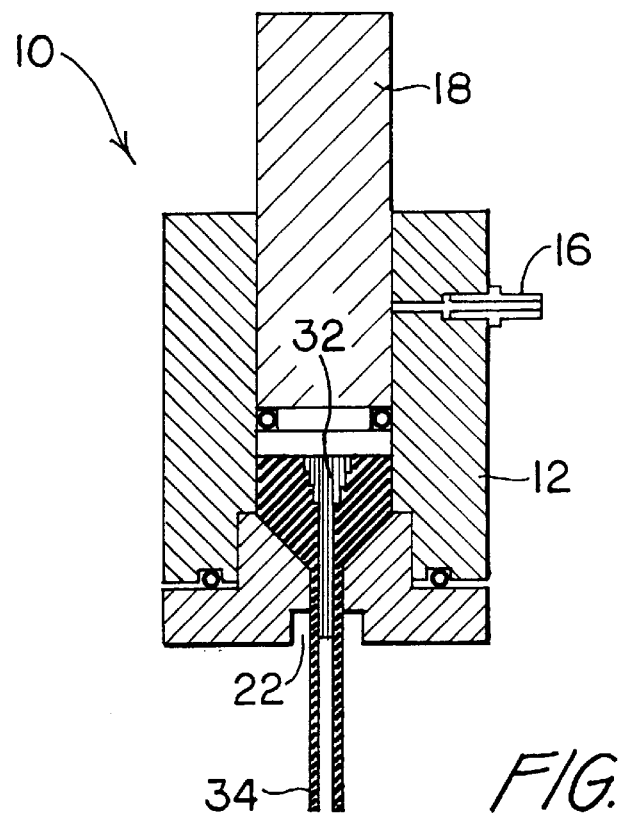
FIG. 6 is a cross-section of a piston extruder used to fabricate hollow superconducting wires and rods in accordance with the present invention.

In spite of the extended drying periods and slow heating rates, thicker rods, having diameters 10 mm and above, may have poor properties due to the formation of cracks. The formation of cracks in thicker rods can be completely avoided by the extrusion of hollow rods. This is accomplished by attaching a mandrel 32 to the ram 18 of piston extruder 10, as shown in FIG. 6.

B. Additional Processing Step for YBCO.

In the case of YBCO based superconducting wires and rods, an additional and final process step is to subject the green compact to sintering. The material and sintering process variables, such as particle size and distribution, sintering temperature, time, and atmosphere are controlled to develop different microstructures in the wire or rod. For example, the initial YBCO superconducting powder typically consists of uniformly fine particles of size 2–5 $\mu$m. After processing steps (i)–(v) are performed on this YBCO powder, the resulting green compact is subjected to sintering at about 900° C. in an oxygen atmosphere for about 24 hours. This results in the wire or rod having a fine microstructure with a uniform grain size of 5 $\mu$m, and a density of 90–95% of theoretical density. Higher densities can be achieved by sintering at higher temperatures, but this is accompanied by grain growth, resulting in a coarse microstructure.

An initial superconducting powder with particle size greater than 10 $\mu$m requires higher sintering temperature for proper densification, and therefore the resulting sintered wire or rod has coarse grains. The preferred particle size for the YBCO powder is in the range of about 2–5 $\mu$m.

The superconducting YBCO powder usually contains small amounts of low melting impurities like $BaCuO_2$, $Y_2BaCuO_5$ and CuO, and the liquid phases of these impurities cause excessive grain growth. The large grains are accompanied by cracks and segregation of impurities which cause the value of the critical current ($J_c$) to drop across a segment containing a large grain. Therefore, a uniformly fine microstructure is desirable, for good superconducting and mechanical properties. Shortening the sintering time to less than 24 hours results in lower density, while increasing the sintering time does not have any significant effect and is a waste of furnace time and energy. The wires and rods sintered in oxygen have a coarser microstructure compared to the wires and rods sintered in air, but have lower $J_c$ values. This is because sintering in oxygen removes residual carbon and carbon dioxide more efficiently, leading to a cleaner grain boundaries.

C. Additional Processing Steps for BSCCO.

The fabrication of BSCCO wires and rods is similar to that of YBCO wires and rods. However, one difference is the amount of additives. The initial powder, in the case of BSCCO, has a plate-like morphology compared to the granular nature of the YBCO particles. To achieve the Theological characteristics most suitable for plastic extrusion, the amount of additives, in particular the amount of solvent, is increased. The different amounts of the various additives is shown in the table of FIG. 1. As indicated above, process steps (i)–(v) are common to both YBCO and BSCCO compounds.

The major factors influencing the properties of BSCCO wires and rods are the orientation of grains, the composition of the phases present, and the mass density. The sequence of reactions, by which the precursor chemicals react to form the superconducting 2223 phase, and their reaction kinetics make it possible to achieve a highly oriented, polycrystalline microstructure by appropriate mechanical loading and heat treatment steps discussed below. See H. Kumakura, K Togano and H. Maeda, *J. of Appl. Phys.*, 67 (1990), which is incorporated herein by reference.

Cold Isostatic Pressing-1

Cold isostatic pressing (CIP) is normally done for densification of powder compacts. The powder is packed in an air-tight flexible can or container, like a rubber bag, and this is placed in a high pressure chamber. The chamber is pressurized by a liquid, usually water, and this causes uniform packing of the powder.

This cold isostatic pressing technique can be used to increase the density of BSCCO wires and rods. The extrusion process induces a certain amount of orientation in the BSCCO wires and rods, particularly on the surface, but this does not significantly affect the properties. With cold isostatic pressing, the BSCCO wires and rods are subjected to a quasiisostatic load in such a way that the wire or rod experiences maximum load in the radial direction. This is accomplished by using a loading fixture 36 as shown in FIG.

Figure 7B:
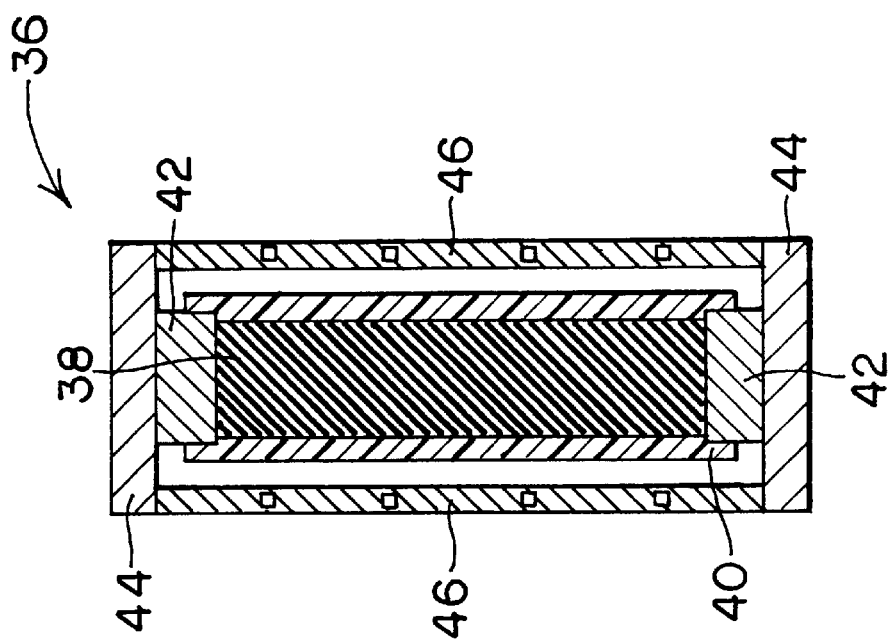
FIGS. 7a and 7b are cross-sectional drawings of an assembly as used for cold isostatic pressing in the fabrication of superconducting wires and rods in accordance with the present invention.
Figure 7A:
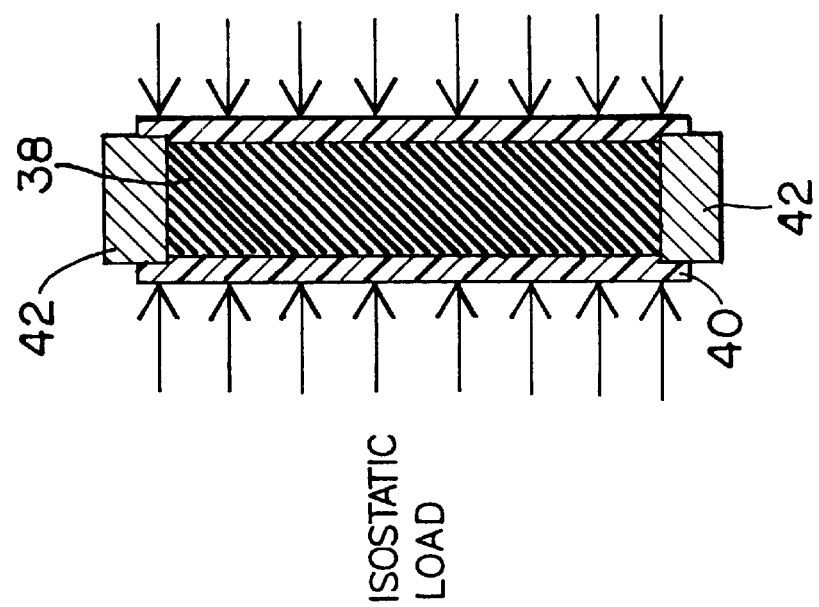

7b. See also FIG. 7a. The extruded wire or rod (after binder burn-out) 38 is packed inside a latex tube 40, and stoppers 42, preferably made of neoprene, are used as closures to seal both ends of the tube. A disk 44, preferably made of steel, is attached to each stopper 42. This assembly is then placed in a support structure or frame 46. When an isostatic load is applied, the support structure 46 bears the axial load, and the wire or rod 38 experiences a mostly radial load. The isostatic load applied is preferably about 40 ksi. FIG. 7a illustrates fixture 36 without support frame 46 and represents the radial load applied to the wire or rod by the plurality of arrows pointing towards tube 40.

A mandrel or rod should be inserted into the hollow space of a hollow BSCCO rod prior to applying an isostatic load to such rod. The inserted mandrel or rod should substantially fill the hollow space. This measure helps prevent damage to hollow rods when the isostatic load is applied.

Heat Treatment-1

The precursor superconducting powder used in the fabrication of BSCCO wires and rods is a mixture of Bismuth Oxide, Lead Oxide, Strontium Carbonate, Calcium Carbonate and Copper Oxide powders. The precursor powder is available from a company called Seattle Specialty Ceramics. The powders are mixed in the stoichiometric ratio needed to yield the 2223 phase upon a heat treatment of the BSCCO wire or rod (after the cold isostatic pressing step discussed above).

The reactions leading to the formation of the 2223 phase are as follows:
(a) $Bi_2O_3$, PbO, $SrCO_3$, $CaCO_3$, CuO—2201, 2212, CuO, $Ca_2PbO_4$, (Sr, Ca) Cuprates
(b) $Ca_2PbO_4$, 2201—Liquid Phase (rich in Ca, Cu)
(c) 2212, Liquid Phase, (Sr, Ca) Cuprates—2223
See S. S. Oh and K. Osamura, *J. of Mat. Sci.*, 26 (1991), which is incorporated herein by reference.

The role of lead is to enhance the dissolution of the 2212 phase and the strontium-calcium cuprates in the liquid, thereby promoting the formation of the 2223 phase. The cold isostatic pressing step discussed above causes the intermediate liquid phase to spread perpendicular to the packing direction, and this leads to alignment of the 2223 phase.

The formation of the 2223 phase in BSCCO wires and rods by heat treatment is greatly influenced by the furnace atmosphere and temperature. It has been shown by several researchers that a reduced oxygen environment helps the formation of the 2223 phase. See U. Endo, S. Koyama and T. Kawai, *Jap. J. of Appl. Phys.*, 27 (1988), which is incorporated herein by reference.

In the present invention, the preferred furnace atmosphere used in the heat treatment of the BSCCO wire or rod is about 9% oxygen and about 91% argon. The processing temperature depends upon the furnace atmosphere. For the 9% oxygen atmosphere, heating at about 830° C. results in an almost complete 2223 phase. Small amounts of copper oxide and strontium-calcium cuprates are always present. However, they do not have a major influence on the final properties. The preferred processing temperature has a very narrow window and a deviation of 5° C. will lead to the presence of other phases like 2212, thereby affecting the overall properties of the sample. See S. S. Oh and K. Osamura, *Supercond. Sci. Tech.*, 4 (1991), which is incorporated herein by reference. Processing times ranging from 70 to 150 hours have been reported in various publications for the complete formation of the 2223 phase. In the present invention, the sample is preferably processed for about 72 hours. It has been determined through x-ray diffraction studies that this results in an at least 90% 2223 phase.

Cold Isostatic Pressing-2

One of the major problems at this stage of processing is that the density of the specimen decreases with the formation of 2223. The extruded wire or rod (after binder burn-out) 38 has a density of 3 gm/cc. After the cold isostatic pressing, this increases to 4.5 gm/cc. But the formation of 2223 phase during the heat treatment results in a drastic decrease in the mass density to approximately 2.3 gm/cc. See S. S. Oh and K. Osamura, *Supercond. Sci. Tech.*, 4 (1991), which is incorporated herein by reference. Thus, in spite of being made up of the 2223 phase, the wire or rod has very poor mechanical and superconducting characteristics and requires further densification by a second cold isostatic pressing step. The wire or rod 38 is packed again in the latex tube 40, placed in the support fixture 46 described above, and subjected to an isostatic load of 60 ksi. This increases the mass density to 5.2 gm/cc (about 80% theoretical density). This loading also improves the alignment of the 2223 platelets formed during the heating treatment. However, an undesirable effect of the cold isostatic pressing is the introduction of fine compaction cracks.

Heat Treatment-2

A second heat treatment is done at about 840° C. in an atmosphere of about 9% oxygen and 91% argon for about 72 hours. This step results in healing of cracks formed during the second isostatic pressing, growth of the 2223 grains mostly in the preferred direction, and also transformation of the remaining constituents into the 2223 phase.

II. Characteristics of YBCO Wires and Rods Fabricated by the Present Invention

A. Electrical Properties.

Figure 8:
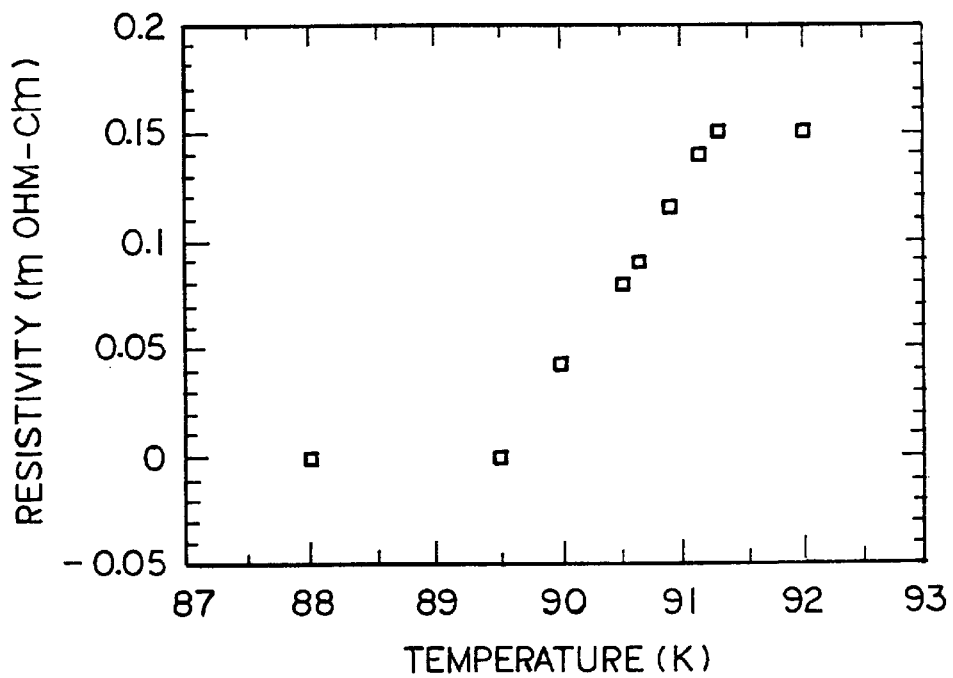
FIG. 8 is a resistivity versus temperature graph for superconducting wires and rods fabricated in accordance with the present invention.

Though the plastic extrusion process requires the addition of organics to the YBCO powder during the early processing stages, this does not affect the electrical properties of the resulting wire or rod. This can be seen from the resistivity versus temperature curve in FIG. 8 for YBCO wires and rods. Transition to the superconducting state starts at 91° C. and the transition width is 2° C., which is the normal value for a good YBCO superconducting product.

Figure 9:
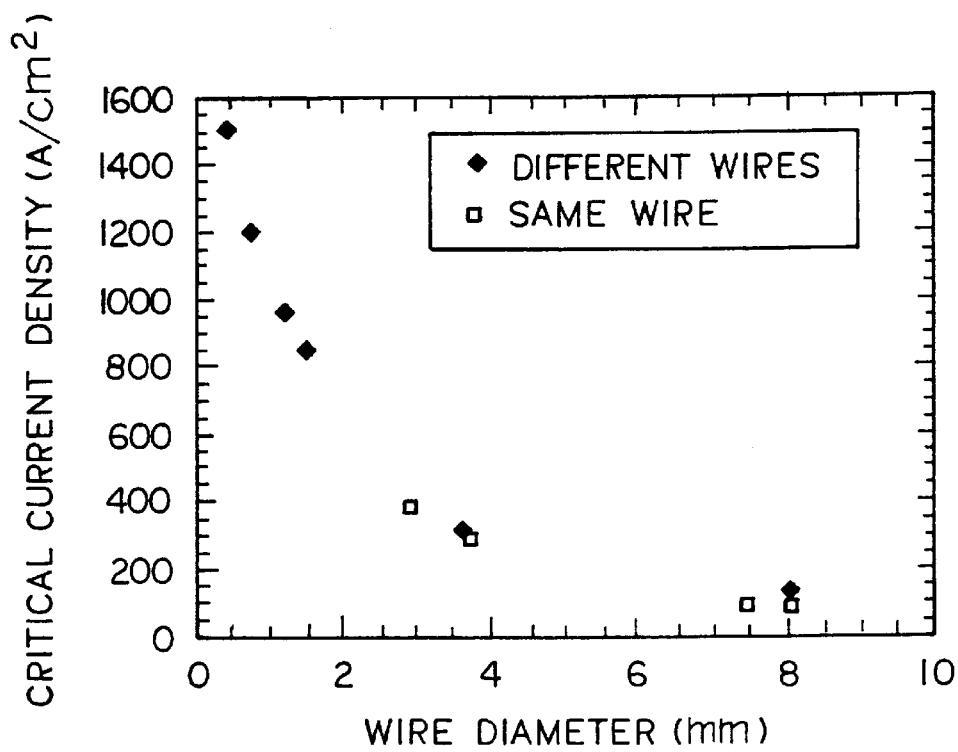
FIG. 9 is a critical current density versus diameter curve for superconducting wires and rods fabricated in accordance with the present invention.

The $J_c$ values of YBCO wires and rods of various diameters is shown in FIG. 9. A significant increase in the $J_c$ value is observed with a decrease in wire/rod diameter from 8.0 mm to 0.38 mm. The reason for this behavior is the self-field effect due to the current. See I. Bransky and J. Bransky, *J. Appl. Phys.*, 66, 5510 (1989), which is incorporated herein by reference.

The measured $J_c$ values remain constant over large lengths of wires or rods. In some specimens, small drops in the $J_c$ values are caused by the presence of defects, such as cracks or pores, but in the absence of defective segments, the $J_c$ values are uniform over long lengths.

An extruded wire or rod of the present invention is flexible before drying and can be wound to form coils or other desired shapes. For example, a 150 cm long wire of diameter 0.75 mm was made by folding the wire over a 30 cm long quartz plate immediately after extrusion. This wire is free of surface defects like cracks or pores over its entire length, and the $J_c$ value of this wire is uniform and above 1100 A/cm$^2$.

The $J_c$ values of YBCO rods is shown in the table of FIG. 10. In FIG. 10, the rods with inner diameter values are hollow. Hollow rods have a higher $J_c$ value than solid rods of the same diameter, and the properties of the hollow rods are also more consistent.

B. Mechanical Properties.

The fracture strength and fracture toughness are two of the critical properties that govern the mechanical integrity of superconducting wires and rods during operation. See M. K. Ihm, B. R. Powell and R. L. Bloink, *J. Mat. Sci.,* 25, 1664 (1990); and F. Yeh and K. W. White, *J. Appl. Phys.,* 70, 4989 (1991), which are incorporated herein by reference. The flexural-strength or the modulus of rupture affords a convenient basis for comparing the mechanical properties of ceramic materials. Three-point bend tests were done in accordance with ASTM Standard, F417-78, "Standard Test Method For Electronic Ceramics." The fracture toughness was measured on straight notched specimens cut from thick rods. The fine grained wires and rods, which have the best electrical properties, are also found to possess the best mechanical characteristics. The modulus of rupture of these fine grained YBCO wires and rods is about 160 MPa, and the fracture toughness is in the range of 1.0 to 1.3 MPa$\overline{m}$.

III. Characteristics of BSCCO

The plastic extrusion process for BSCCO superconducting powder results in partially aligned, polycrystalline wires and rods with an almost 100% BSCCO 2223 phase. The mass density of these rods is 5.25 grams/cc. The average critical current density of these rods is about 650 amperes/$cm^2$ and depends on the diameter of the wire or rod. Examples of the typical dimensions of BSCCO rods fabricated in accordance with the present invention, and their current capacities, are shown in the table of FIG. 11.

IV. Example of a YBCO Rod Fabricated in Accordance with the Present Invention

The various steps in the fabrication of a polycrystalline YBCO rod of diameter 0.8 cm and length 30 cm are described below.

Step 1: Extrusion Die

An extruded wire or rod undergoes considerable shrinkage during the various stages of processing. Drying of the extruded wire or rod results in a shrinkage of 5% and sintering causes a reduction of 16%. The final sintered diameter is close to 80% of the extrusion nozzle diameter. Hence, an extrusion nozzle with a diameter of 1.0 cm is used to fabricate a rod with a final diameter of 0.8 cm.

Step 2: Paste Preparation

An extruded wire or rod shrinks in the axial direction also, and therefore to achieve a final rod length of 30 cm, the initial extruded length before drying should be approximately 38 cm. The amount of paste required for this length is about 130 grams. During extrusion, about 70 grams of paste remains in the tapered portion of the piston extruder die and cannot be extruded. Thus, the total quantity of paste required for fabricating the rod is about 200 grams. The polymeric additives (set forth in the table of FIG. 1) are first mixed with about half the desired amount of the solvent, and mixed to completely dissolve all the additives and form a clear, viscous gel. The superconducting powder is then added and thoroughly mixed with this gel. The remaining solvent is added in small amounts and mixed to form an extrudable paste.

Step 3: Extrusion

The piston extruder is assembled with the 1.0 cm extrusion-nozzle, and the nozzle is plugged with an air-tight plug. See FIGS. 2a–c. The paste is cut into small pieces and placed in the barrel. The ram is placed in the barrel. and forms a vacuum tight chamber. The barrel is connected to a vacuum pump and the chamber is subjected to a vacuum of 200 millitorr. The ram is then pushed down and a compaction load of 100 MPa is applied. Next, the nozzle plug is removed and the ram is moved down at a constant rate of 0.2 inch per minute for extruding the rod. The extruded YBCO rod is about 38 cm long.

Step 4: Drying

The extruded YBCO rod is placed on a smooth and rigid base (e.g., a glass plate) and placed in a still air enclosure at room temperature for twelve days. The rod is then transferred to a convection drier, where warm air at 60° C. gently flows over the rod. The rod is held there for thirty days during which time most of the solvent evaporates.

Step 5: Binder Burn-Out and Sintering

The dried rod is placed in a long alumina boat and loaded in a 7.5 cm diameter tube furnace. A continuous flow of oxygen at a rate of 2 liters per minute (at atmospheric pressure) is maintained and the furnace is heated at a rate of 6° C. per hour until a temperature of 300° C. is reached. Beyond this temperature, the oxygen flow rate is reduced to 0.25 liters per minute, and the heating rate is increased to 20° C. per hour until a temperature of 500° C. is reached to complete the binder burn-out process. The heating rate can be further increased to 40° C. per hour until the temperature reaches 900° C. At the temperature of 900° C., the sample is held for 24 hours for sintering and it is then cooled to room temperature at the rate of 30° C. per hour.

Step 6: Oxygen Annealing

The YBCO material in the rod is in a tetragonal, non-superconducting phase at temperatures above 600° C. After sintering, and during cooling down to room temperature, the rod absorbs oxygen from the atmosphere and this transforms the rod to an orthorhombic superconducting phase. In order to ensure that this transformation is complete, the material can be exposed to an oxygen atmosphere at 500° C. for a period of 24 hours. This is either done while cooling after sintering or as an additional processing step.

These processing steps produce a YBCO rod with a 0.8 cm diameter and a 30 cm length, and with good superconducting and mechanical properties. The rod is cut to the required length on a diamond saw.

V. Experiments Conducted to Determine the Processing Parameters

Figure 12:
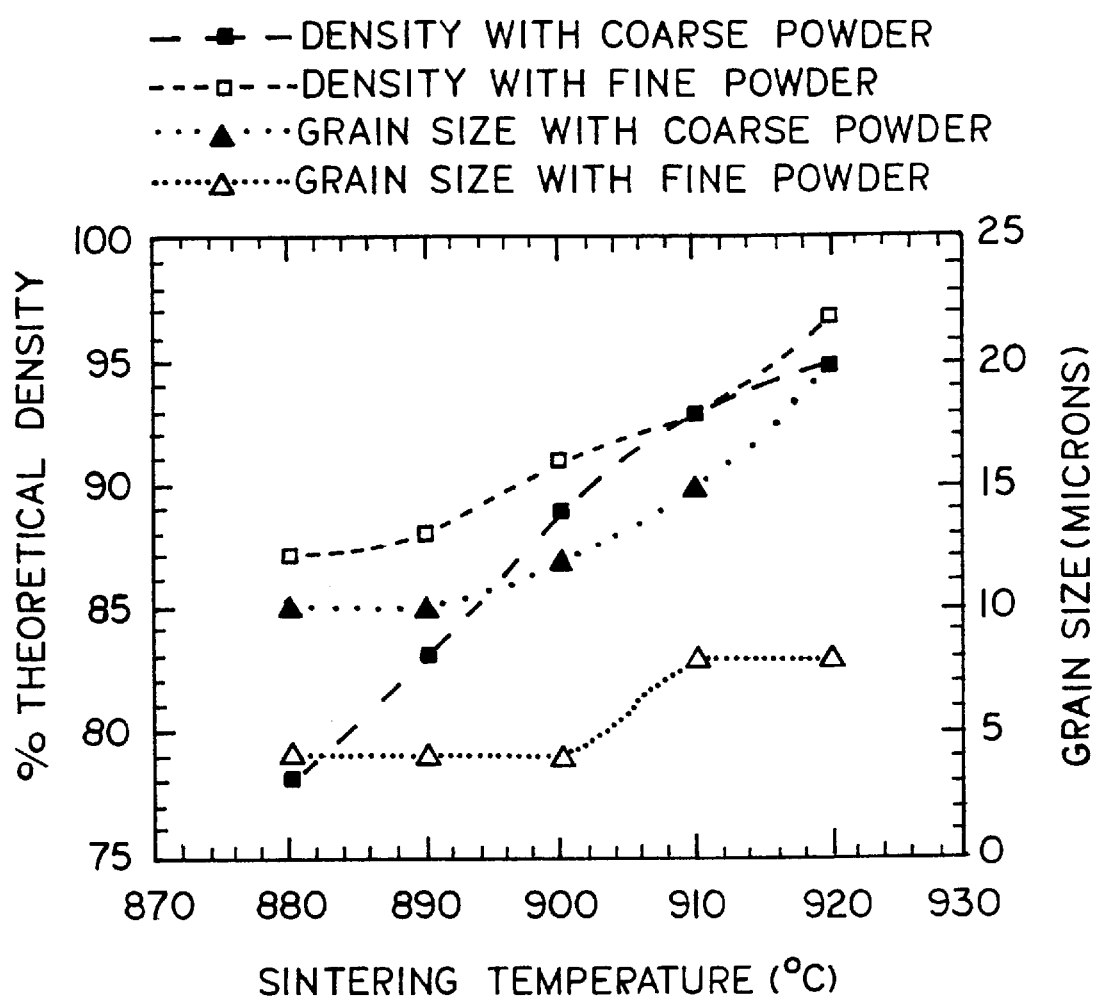
FIG. 12 is a theoretical density and grain size versus sintering temperature graph for superconducting wires and rods fabricated in accordance with the present invention.
Figure 13:
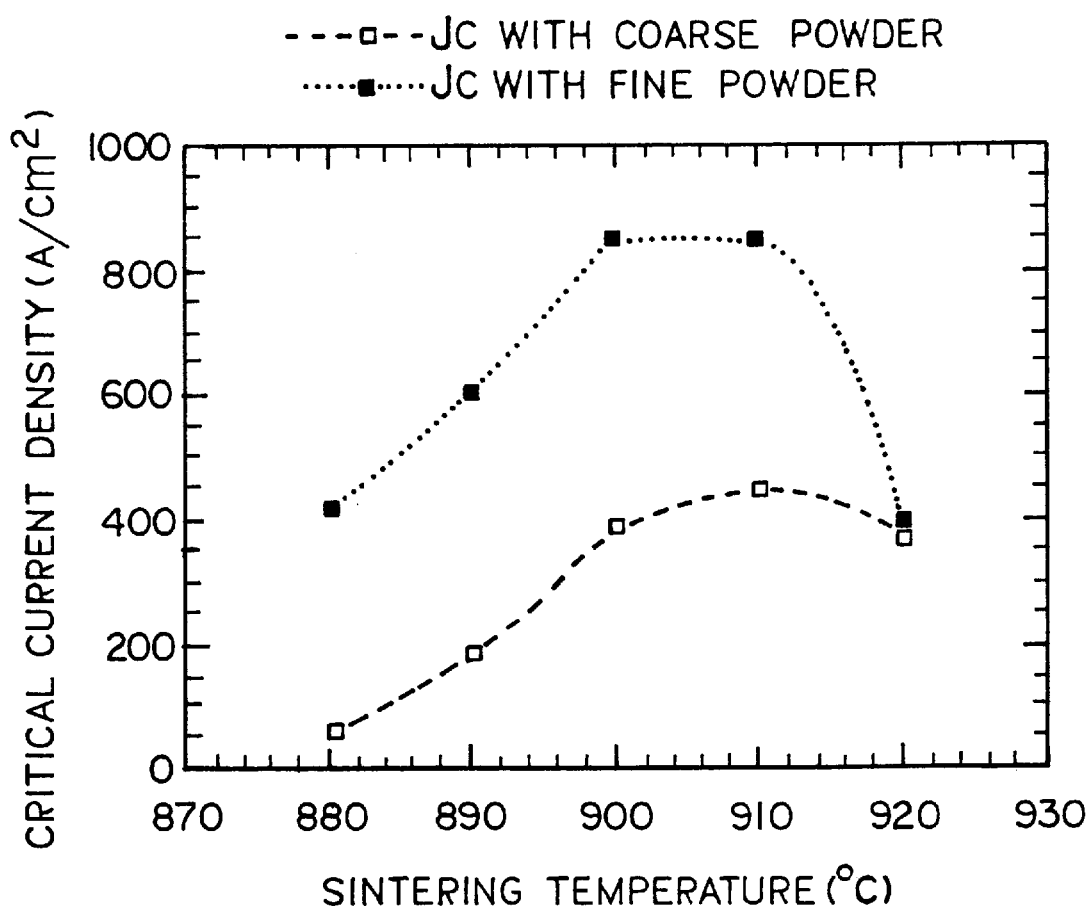
FIG. 13 is a critical current density versus sintering temperature graph for superconducting wires and rods fabricated in accordance with the present invention.
Figure 14:
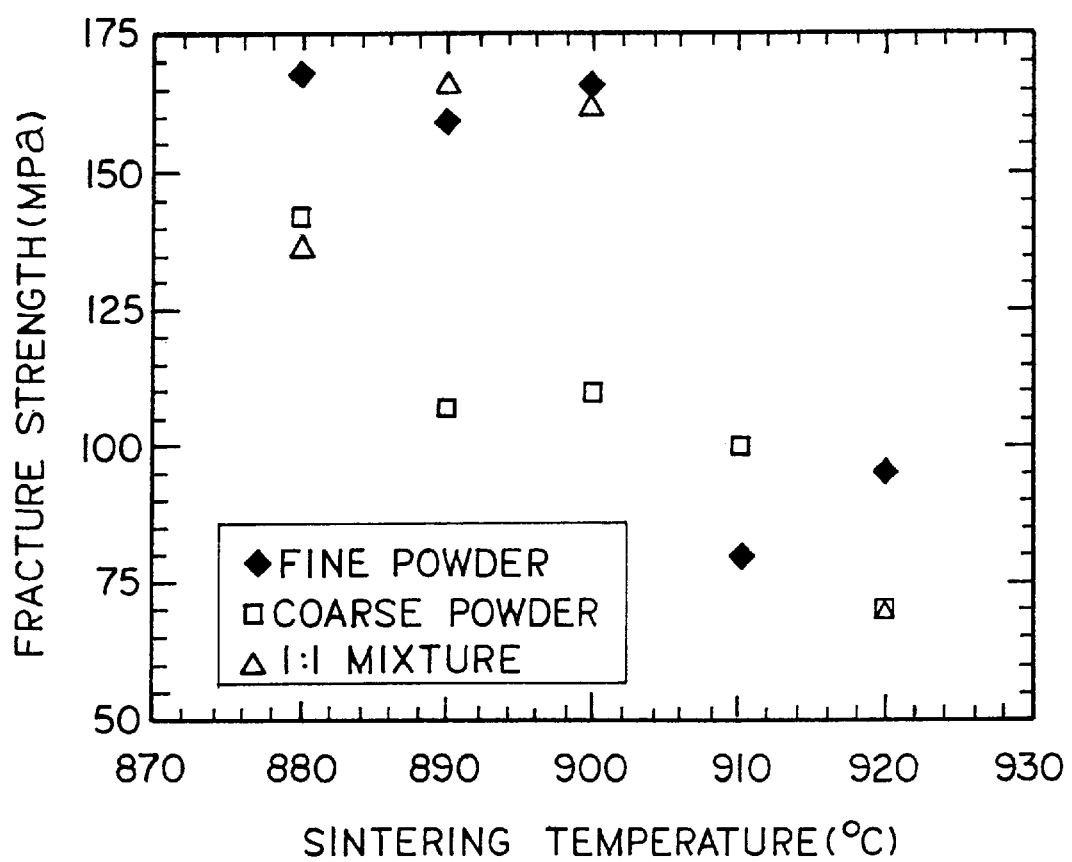
FIG. 14 is a fracture strength versus sintering temperature graph for superconducting wires and rods fabricated in accordance with the present invention.

Several experiments were conducted to determine the processing parameters. FIGS. 12–14 show the effect of the initial powder and sintering temperature on the grain size, mass density and critical current density, and are examples of some of the testing conducted to determine the processing parameters.

FIG. 12 illustrates the effect of sintering temperature on grain size and specimen density for fine and course initial powders. As illustrated, at any temperature, fine powder has better density than coarse powder. Increasing the sintering temperature of fine powder causes the density to increase, but it can be seen that above 900° C., the grain size becomes coarser. This results in a drop in the critical current density, as shown in FIG. 13. As is also illustrated, the critical current density of fine powder is higher at all temperatures. From these experiments, it was concluded that the most suitable microstructure can be achieved by sintering fine powder at a temperature of about 900° C.

FIG. 14 illustrates how fracture strengths of wires and rods are affected by different processing conditions.

VI. Applications of Superconducting Wires and Rods Fabricated by the Present Invention One of the potential applications for wires and rods fabricated by the present invention is use as current leads in low $T_c$ superconducting equipment. Superconducting electromagnets made from Low $T_c$ superconductors, such as Niobium-Tin and Niobium-Titanium alloys, are currently being used in various equipment including magnetic resonance imagers, magnetic energy storage, and particle accelerators. These superconductors are operated at a liquid helium temperature of 4.2 K. Presently, metallic leads are used for feeding current from room temperature to these low temperature superconductors. The operating currents of these magnets range from a few hundred to a few thousand amperes. The metallic leads increase helium consumption because they conduct heat and cause ohmic resistance heating. Use of the superconductor wires and rods of the present invention as leads will reduce this resistance heating, and due to their low thermal conductivity, also reduce the heat conduction, thereby cutting down the liquid helium consumption.

These superconducting leads can be made as single, large area wires or as a rod comprising a multifilament composite of wires. Since smaller wires have a higher $J_c$ value, a multifilament conductor made up of several wires is likely to carry higher currents than a single large diameter superconducting rod. A multifilament conductor having an overall critical current of 185 A has been constructed by stacking twenty wires, each having a critical current of 10 A.

Current leads made from the superconducting wires or rods can also be used in smaller scale applications such as in cryogenic experiments, scanners in spacecrafts, and low current magnets.

The present invention, therefore, is well adapted to carry out the objects and attain the ends and advantages mentioned herein as well as other ends and advantages made apparent from the disclosure. While preferred embodiments of the invention have been described for the purpose of disclosure, numerous changes and modifications to those embodiments described herein will be readily apparent to those skilled in the art and are encompassed within the spirit of the invention and the scope of the following claims.

What is claimed is:

1. An extrusion process for extruding superconducting wires and rods, comprising the steps of:
    (a) providing a piston extruder comprising a die barrel, an extrusion nozzle, and a ram;
    (b) closing said extrusion nozzle;
    (c) loading extrudable paste in the form of granules into said die barrel, said extrudable paste comprising superconducting powder, a binder, a plasticizer, a lubricant, triolein as a dispersant, and a solvent;
    (d) subjecting said die barrel to a vacuum of about 200 millitorr;
    (e) compacting said extrudable paste by using said ram to apply a compaction stress of about 100 MPa;
    (f) opening said extrusion nozzle; and
    (g) extruding a wire rod through said extrusion nozzle using said ram, said ran moving at a rate of about 0.02 to 0.1 inch/minute.

2. The extrusion process of claim 1, further comprising the step of forming a hollow rod by attaching a mandrel to said ram.

3. The extrusion process of claim 1, wherein said granules of extrudable paste are cubes having sides measuring about 2 to 3 mm.

4. The extrusion process of claim 2, wherein said granules of extrudable paste are cubes having sides measuring about 2 to 3 mm.

5. The extrusion process of claim 1, further comprising the steps of:
    initially drying said wire or rod in still air at room temperature until about 20% of said solvent is removed; and subsequently drying said wire or rod in flowing air at a temperature of about 60° C. until all remaining solvent is removed.

6. The extrusion process of claim 5, further comprising the step of forming a hollow rod by attaching a mandrel to said ram.

7. The extrusion process of claim 5, further comprising the steps of:
    initially heating said wire or rod in flowing oxygen until a temperature of about 100° C. is reached;
    subsequently heating said wire or rod in flowing oxygen at a rate in the range of about 6 to 15° C./hour until a temperature of about 300° C. is reached; and
    thereafter heating said wire or rod in flowing oxygen at a rate of about 20° C./hour until a temperature of about 500° C. is reached.

8. The extrusion process of claim 7, further comprising the step of forming a hollow rod by attaching a mandrel to said ram.

9. A process for fabricating superconducting wires and rods, comprising the steps of:
    (a) providing a piston extruder comprising a die barrel, an extrusion nozzle, and a ram;
    (b) closing said extrusion nozzle;
    (c) loading extrudable paste in the form of granules into said die barrel, said extrudable paste comprising YBCO powder, a binder, a plasticizer, a lubricant, triolein as a dispersant, and a solvent;
    (d) subjecting said die barrel to a vacuum of about 200 millitorr,
    (e) compacting said extrudable paste by using said ram to apply a compaction stress of about 100 MPa;
    (f) opening said extrusion nozzle;
    (g) extruding a wire or rod through said extrusion nozzle using said ram, said ram extruding said wire or rod at a rate of about 0.02 to 0.1 inch/minute;
    (h) initially drying said wire or rod in still air at room temperature until about 20% of said solvent is removed,
    (i) subsequently drying said wire or rod in flowing air at a temperature of about 60° C. until substantially all remaining solvent is removed;
    (j) initially heating said wire or rod in flowing oxygen until a temperature of about 100° C. is reached;
    (k) subsequently heating said wire or rod in flowing oxygen at a rate in the range of about 6 to 15° C./hour until a temperature of about 300° C. is reached;
    (l) thereafter heating said wire or rod in flowing oxygen at a rate of about 20° C./hour until a temperature of about 500° C. is reached; and
    (m) sintering said wire or rod at about 90° C. in an oxygen atmosphere for about 24 hours.

10. The extrusion process of claim 9, further comprising the step of forming a hollow rod by attaching a mandrel to said ram.

11. The process of claim 9, wherein said dispersant is triolein.

12. The process of claim 9, further comprising the step of exposing said wire or rod to an oxygen atmosphere at a temperature of about 500° C. for about 24 hours.

13. A process for fabricating superconducting wires and rods, comprising the steps of:
    (a) providing a piston extruder comprising a die barrel, an extrusion nozzle, and a ram;

(b) closing said extrusion nozzle;
(c) loading extrudable paste in the form of granules into said die barrel, said extrudable paste comprising BSCCO powder, a binder, a plasticizer, a lubricant, triolein as a dispersant, and a solvent;
(d) subjecting said die barrel to a vacuum of about 200 millitorr;
(e) compacting said extrudable paste by using said ram to apply a compaction stress of about 100 MPa;
(f) opening said extrusion nozzle;
(g) extruding a wire or rod through said extrusion nozzle using said ram, said ram extruding said wire or rod at a rate of about 0.02 to 0.1 inch/minute,
(h) initially drying said wire or rod in still air at room temperature until about 20% of said solvent is removed;
(i) subsequently drying said wire or rod in flowing air at a temperature of about 60° C. until substantially all remaining solvent is removed;
(j) initially heating said wire or rod in flowing oxygen until a temperature of about 100° C. is reached;
(k) subsequently heating said wire or rod in flowing oxygen at a rate in the range of about 6 to 15° C./hour until a temperature of about 300° C. is reached;
(l) thereafter heating said wire or rod in flowing oxygen at a rate of about 20° C./hour until a temperature of about 500° C. is reached;
(m) packing said wire or rod in a flexible comtainer;
(n) placing said container in a support fixture;
(o) applying a first isostatic load to said container to densify said wire or rod;
(p) heating said wire or rod, in an atmosphere of about 9% oxygen and about 91% argon, at a temperature of about 830° C. for about 72 hour;
(q) applying a second isostatic load to said container to densify said wire or rod; and
(r) heating said wire or rod, in an atmosphere of about 9% oxygen and about 91% argon at about 840° C. for about 72hours.

14. The process of claim 13, wherein a mandrel is attached to said ram to form a wire or rod with a hollow center, and further comprising the step of inserting a mandrel or rod into said hollow center prior to applying an isostatic load to said wire or rod.

15. The process of claim 13, wherein said dispersant is triolein.

16. A process for fabricating superconducting wires and rods, comprising the steps of:
(a) providing a piston extruder comprising a die barrel, an extrusion nozzle, and a ram;
(b) closing said extrusion nozzle;
(c) loading extrudable paste into said die barrel, said extrudable paste comprising BSCCO powder, a binder, a plasticizer, a lubricant, triolein as a dispersant, and a solvent;
(d) subjecting said die barrel to a vacuum;
(e) compacting said extrudable paste by using said ram to apply a compaction stress of about 100 MPa;
(f) opening said extrusion nozzle;
(g) extruding a wire or rod through said extrusion nozzle using said ram;
(h) initially drying said wire or rod in still air at room temperature until about 20% of said solvent is removed;
(i) subsequently drying said wire or rod in flowing air at a temperature of about 60° C. until substantially all remaining solvent is removed;
(j) heating said wire or rod in flowing oxygen;
(k) packing said wire or rod in a flexible container;
(l) placing said container in a support fixture;
(m) applying a first cold isostatic load to said container to density said wire or rod;
(n) heating said wire or rod, in an atmosphere of about 9% oxygen and about 91% argon, at a temperature of about 830° C.;
(o) applying a second cold isostatic load to said container to density said wire or rod; and
(p) heating said wire or rod, in an atmosphere of about 9% oxygen and about 91% argon at about 840° C.

17. The process of claim 16, wherein the act of providing a piston extruder includes providing a piston extruder having a reduction ratio substantially in a range of 5.5 to 16.0 and having an aspect ratio substantially in a range of 1.0 to 1.6.

* * * * *